US010018683B2

(12) United States Patent
Yoon et al.

(10) Patent No.: US 10,018,683 B2
(45) Date of Patent: Jul. 10, 2018

(54) APPARATUS AND METHOD FOR ESTIMATING OPEN CIRCUIT VOLTAGE

(71) Applicant: LG CHEM, LTD., Seoul (KR)

(72) Inventors: Sung-Yul Yoon, Daejeon (KR); Jeong-Seok Park, Daejeon (KR); Gyong-Jin Oh, Daejeon (KR); Young-Bo Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/315,583

(22) PCT Filed: Oct. 30, 2015

(86) PCT No.: PCT/KR2015/011590
§ 371 (c)(1),
(2) Date: Dec. 1, 2016

(87) PCT Pub. No.: WO2016/068652
PCT Pub. Date: May 6, 2016

(65) Prior Publication Data
US 2017/0199250 A1   Jul. 13, 2017

(30) Foreign Application Priority Data
Oct. 31, 2014   (KR) .................. 10-2014-0150328

(51) Int. Cl.
H02J 7/00      (2006.01)
G01R 31/36     (2006.01)
(Continued)

(52) U.S. Cl.
CPC ... *G01R 31/3658* (2013.01); *G01R 19/16542* (2013.01); *G01R 31/361* (2013.01);
(Continued)

(58) Field of Classification Search
CPC .......... G01R 31/3658; G01R 19/16542; G01R 31/3624; G01R 31/3655; G01R 31/361;
(Continued)

(56) References Cited

U.S. PATENT DOCUMENTS

2006/0022643 A1   2/2006   Brost et al.
2007/0024242 A1   2/2007   Seo et al.
(Continued)

FOREIGN PATENT DOCUMENTS

EP   2 779 302 A1   9/2014
JP   2002-189066 A   7/2002
(Continued)

OTHER PUBLICATIONS

International Search Report for PCT/KR2015/011590 (PCT/ISA/210) dated Mar. 28, 2016.

*Primary Examiner* — Nha Nguyen
(74) *Attorney, Agent, or Firm* — Birch, Stewart, Kolasch & Birch, LLP

(57) ABSTRACT

The present disclosure relates to an open circuit voltage estimating apparatus capable of estimating an open circuit voltage even when a battery cell does not have a rest time. The open circuit voltage estimating apparatus according to an embodiment of the present disclosure includes a current measuring unit configured to measure a charge/discharge current of a battery cell; a current integrating unit configured to integrate the current measured by the current measuring unit starting from an initial time; a time calculating unit configured to calculate a critical time, that is a time in which the integrated current value integrated by the current integrating unit is within a critical range; a cell voltage measuring unit configured to measure a voltage of the battery cell; and an open circuit voltage estimating unit configured to estimate an open circuit voltage of the battery cell by calculating an average value of the voltage measured by the (Continued)

cell voltage measuring unit during an operation time starting from the initial time to the critical time.

8 Claims, 4 Drawing Sheets

(51) Int. Cl.
  *G01R 19/165* (2006.01)
  *H01M 10/48* (2006.01)
(52) U.S. Cl.
  CPC ..... *G01R 31/3606* (2013.01); *G01R 31/3624* (2013.01); *G01R 31/3655* (2013.01); *H01M 10/482* (2013.01); *H02J 7/0016* (2013.01); *H02J 7/0021* (2013.01)
(58) Field of Classification Search
  CPC .. G01R 31/3606; H02J 7/0016; H02J 7/0021; H01M 10/482
  See application file for complete search history.

(56) References Cited

U.S. PATENT DOCUMENTS

| | | | |
|---|---|---|---|
| 2012/0191390 | A1 | 7/2012 | Kang et al. |
| 2014/0009164 | A1 | 1/2014 | Suzuki et al. |
| 2014/0049222 | A1* | 2/2014 | Moorhead ............ H02J 7/0016 320/134 |
| 2014/0139189 | A1* | 5/2014 | Izumi ................. B60L 11/1861 320/134 |
| 2014/0312910 | A1 | 10/2014 | Cho et al. |

FOREIGN PATENT DOCUMENTS

| | | |
|---|---|---|
| JP | 2006-015896 A | 1/2006 |
| JP | 2007-040991 A | 2/2007 |
| JP | 2007-174865 A | 7/2007 |
| JP | 2012-132726 A | 7/2012 |
| JP | 2012-149947 A | 8/2012 |
| JP | 2012-202851 A | 10/2012 |
| KR | 10-2009-0020470 A | 2/2009 |
| KR | 10-2014-0125473 A | 10/2014 |

* cited by examiner

APPARATUS AND METHOD FOR ESTIMATING OPEN CIRCUIT VOLTAGE

TECHNICAL FIELD

The present application claims the benefit of Korean Patent Application No. 10-2014-0150328 filed on Oct. 31, 2014 with the Korean Intellectual Property Office, the disclosure of which is incorporated herein by reference in its entirety.

The present disclosure relates to a technology of managing a secondary battery, and more particularly, to a technology of estimating an open circuit voltage of the secondary battery necessary for monitoring and controlling performance of the secondary battery.

BACKGROUND ART

Along with the recently increased demand for portable electronic products such as laptop computers, video cameras, mobile phones, and so on, the development of electric vehicles, energy storage batteries, robots, satellites, and so on started in earnest and led into active researches on high-performance secondary batteries capable of repeated charging and discharging.

Currently, commercially available secondary batteries comprise nickel cadmium, nickel hydrogen, nickel zinc and lithium secondary batteries. Among them, lithium secondary batteries have drawn much attention because of little memory effect to allow unrestrained charging/discharging, as well as very low self-discharging rate and high energy density, compared to nickel-based secondary batteries.

Meanwhile, there are cases where such a secondary battery is used in a single battery, but in many cases, the secondary battery is used in a state where a plurality of the secondary batteries are connected in series and/or in parallel so as to be used in a high voltage and/or mass energy storage apparatus. Further, the secondary battery is generally used in the form of a battery pack or a battery system that includes a plurality of battery cells and a battery management apparatus configured to control overall charge/discharge operations of the battery cells.

Further, such a battery management apparatus used in the battery pack performs the function of monitoring a state of the battery using a temperature sensor, a current sensor, a voltage sensor and the like and using results of such monitoring to estimate a state of charge (SOC) or a state of health (SOH) or to balance a voltage between the battery cells, or to protect the battery from high voltage, overcurrent, low temperature and high temperature, etc.

Meanwhile, in many cases, a conventional battery management apparatus measures and uses an open circuit voltage (OCV) of the battery cell in order to perform the management functions such as estimating the state of charge (SOC), estimating the state of health (SOH) and cell balancing, etc. The open circuit voltage of a battery cell refers to the voltage of the battery cell in a state where an external load or an external circuit is not connected or in a stabilized state where a charge/discharge operation of the battery cell is not performed. Here, the reason why the open circuit voltage of the battery cell is different from the actual voltage measured from the battery cell is known to be because of internal resistance (ohmic polarization) of the cell and the polarization phenomenon and the like related to movements of electrons in an electrode/electrolyte interface.

But, in order to measure an exact open circuit voltage, it is necessary to stop using the battery cell, and sufficient time must lapse prior to making the measurement. That is, in order to measure the exact open circuit voltage, the battery cell needs to be in a non-charged/discharged state.

However, in many cases, information on an open circuit voltage is required in real time in the process of charging/discharging. Further, depending on the type of apparatus where the battery is being applied, there are cases where charging/discharging continues without any non-operation period of the battery. For example, an energy storage system (ESS) used in frequency regulation of power generation equipment performs charging/discharging continuously without a rest time. Therefore, in the case of a battery used in such an apparatus, there is a problem that it is difficult to measure the open circuit voltage.

(Prior art document) Korean Laid-open Patent no. 10-2009-0020470 (laid-open on Feb. 26, 2009)

DISCLOSURE

Technical Problem

The present disclosure is designed to solve the problems of the related art, and therefore the present disclosure is directed to providing an open circuit voltage estimating apparatus capable of estimating an open circuit voltage even when the battery cell does not have a rest time.

The other objectives and advantages of the present disclosure can be understood with the following description and more clearly with the embodiments of the present disclosure. Also, it should easily be understood that the other objectives and advantages of the present disclosure can be implemented by the means described in the claims and the combinations thereof.

Technical Solution

The applicant became aware of the aforementioned problems and found out while continuously conducting researches thereon that an open circuit voltage of a battery cell follows the charge/discharge voltage of the battery cell, and that removing from the voltage of the battery cell a voltage component adjusted due to the IR effect caused by internal resistance results in a value that is very close to the open circuit voltage of the battery cell.

Based on the aforementioned, the applicant came up with a technology of measuring the voltage of the battery cell until a (+) voltage component being integrated due to the IR effect as the battery cell is charged and a (−) voltage component being subtracted due to the IR effect as the battery cell is discharged offset each other, and estimating an average value of the voltage of the battery cell measured until the offset as the open circuit voltage of the battery cell.

Various embodiments of the present disclosure for achieving the aforementioned purposes are as follows.

(1). An open circuit voltage estimating apparatus including: a current measuring unit configured to measure a charge/discharge current of a battery cell; a current integrating unit configured to integrate the current measured by the current measuring unit starting from an initial time; a time calculating unit configured to calculate a critical time, that is a time where the integrated current value integrated by the current integrating unit is within a critical range; a cell voltage measuring unit configured to measure a voltage of the battery cell; and an open circuit voltage estimating unit configured to estimate an open circuit voltage of the battery cell by calculating an average value of the voltage measured by the cell voltage measuring unit during an operation time starting from the initial time until the critical time.

(2). In (1), the time calculating unit may calculate a time point in which the integrated current value is 0, as the critical time.

(3). In (1), the time calculating unit may calculate a time where a mathematical symbol of the integrated current value changes, as the critical time.

(4). In any one of (1) to (3), the open circuit voltage estimating unit may calculate the average value of the voltage by integrating a cell voltage for a time during the operation time and dividing the integrated cell voltage by the operation time.

(5). A cell balancing apparatus including: the open circuit voltage estimating apparatus of any one of (1) to (4); and a balancing circuit configured to perform balancing between battery cells included in a battery assembly using an open circuit voltage estimated by the open circuit voltage estimating apparatus.

(6). A battery pack including the open circuit voltage estimating apparatus of any one of (1) to (4).

(7). An energy storage system including the open circuit voltage estimating apparatus of any one of (1) to (4). The energy storage system may be an energy storage system for frequency adjustment being used in frequency adjustment of power generation equipment.

(8). An open circuit voltage estimating method including: measuring a charge/discharge current of a battery cell; integrating the current measured at the measuring step starting from an initial time; calculating a critical time, that is a time in which the integrated current value integrated at the current integrating step is within a critical range; measuring a voltage of the battery cell; and estimating an open circuit voltage of the battery cell by calculating an average value of the voltage measured at the voltage measuring step during an operation time starting from the initial time until the critical time, and estimating the calculated average value of the voltage as the open circuit voltage of the battery cell.

(9). In (8), the critical time calculating step may calculate a time point in which the integrated current value is 0, as the critical time.

(10). In (8), the operation time calculating step may calculate a time in which a mathematical symbol of the integrated current value changes, as the critical time.

(11). In any one of (8) to (10), the open circuit voltage estimating step may calculate the average value of the voltage by integrating a cell voltage for a time during the operation time and dividing the integrated cell voltage by the operation time.

Advantageous Effects

The present disclosure gives the following effects.

According to the present disclosure, it is possible to estimate an open circuit voltage of a battery cell while charging/discharging of the battery cell continues. Therefore, according to the present disclosure, it is possible to estimate an open circuit voltage of a battery applied to an application that does not have a rest time.

According to an aspect of the present disclosure, it is possible to estimate an open circuit voltage of a battery cell, and perform balancing between the battery cells using the estimated open circuit voltage. By doing this, it is possible to prevent beforehand accidents that may occur due to voltage deviation or SOC deviation between battery cells. The present disclosure can provide a variety of effects other than those mentioned above, which will become apparent from the following descriptions and further elucidated from the embodiments of the present disclosure.

DESCRIPTION OF DRAWINGS

Other objects and aspects of the present disclosure will become apparent from the following descriptions of the embodiments with reference to the accompanying drawings in which.

The accompanying drawings illustrate preferred embodiments of the present disclosure and, together with the foregoing disclosure, serve to provide further understanding of the technical features of the present disclosure. However, the present disclosure is not to be construed as being limited to the drawings.

BEST MODE

Figure 1:
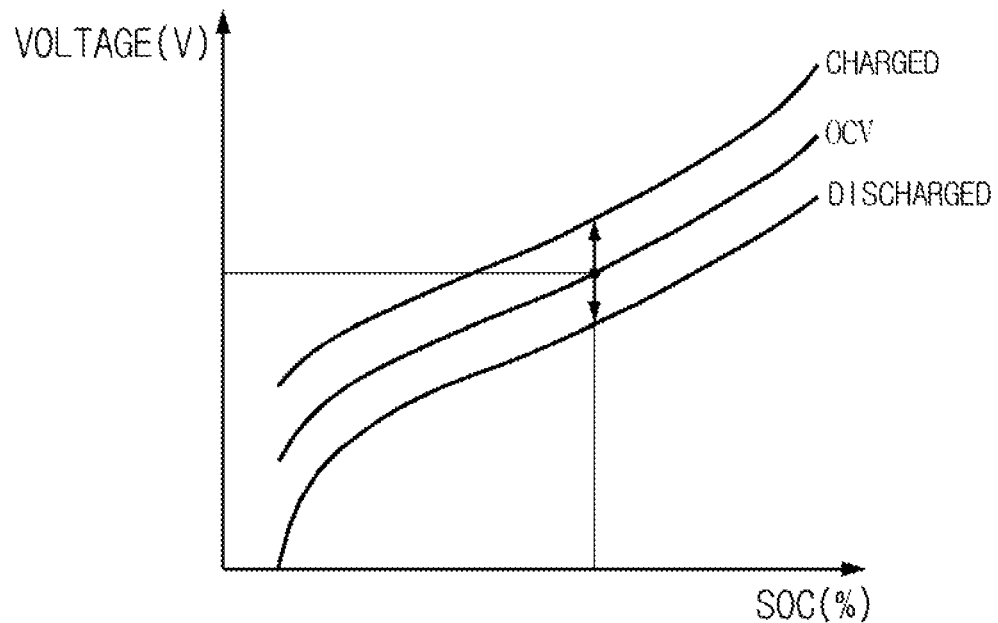
FIG. 1 is a graph illustrating a battery cell voltage measured when a battery cell is in a charged state and a battery cell voltage measured when the battery cell is in a discharged state, in comparison with an open circuit voltage of the battery cell.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the embodiments disclosed in the present specification and the configurations illustrated in the drawings are merely the most preferred embodiments of the present disclosure, and not all of them represent the technical ideas of the present disclosure, and thus it should be understood that there may be various equivalents and modified examples that could substitute therefore at the time of filing the present application.

Further, in explaining the present disclosure, any specific explanation on a well-known related configuration or function deemed to obscure the gist of the present disclosure will be omitted.

Prior to explaining an open circuit voltage estimating apparatus according to an aspect of the present disclosure, voltage change behavior of a battery cell caused by charging/discharging of the battery cell will be explained.

FIG. 1 is a graph illustrating a battery cell voltage measured when a battery cell is in a charged state and a battery cell voltage measured when the battery cell is in a discharged state, in comparison with an open circuit voltage of the battery cell.

In FIG. 1, the horizontal axis (x axis) represents the state of charge (SOC) of the battery cell, and the vertical axis (y axis) represents the voltage of the battery cell. The open circuit voltage (OCV) of the battery cell may be an indicator representing various characteristics of the battery cell, but in FIG. 1, it is being used as an indicator representing the state of charge (SOC) of the battery cell. That is, if the open circuit voltage of the battery cell is available, it is possible to find out the state of charge (SOC) of the corresponding battery cell.

However, as aforementioned in [BACKGROUND ART], the voltage of a battery cell measured in a state the battery cell is being charged or discharged is different from the open circuit voltage of the battery cell, and it is not easy to estimate the open circuit voltage of the battery cell during charging or discharging of the battery cell.

This can be understood easily with reference to FIG. 1. In FIG. 1, the voltage profile of a charged state displayed 'charged' and the voltage profile of a discharged state displayed 'discharged' are different from the open circuit voltage profile displayed 'OCV'. Therefore, the voltage of the battery cell measured during charging or discharging of the battery cell is different from the open circuit voltage.

However, the applicant found out, as aforementioned, that removing from the voltage of the battery cell a voltage component adjusted due to the IR effect caused by internal resistance results in a value that is very close to the open circuit voltage of the battery cell.

Further, the applicant became aware that although the internal resistance of a battery cell is a variant that changes over time (time variant), it can be regarded as a constant number that does not depend on change of time during a relatively short period of time. Therefore, the applicant became aware that it is possible to integrate the voltage components adjusted due to the IR effect by measuring the value of the current flowing via the battery cell and integrating the measured current values. By doing this, the applicant became aware that it is easy to find a case where the integrated value of the voltage components adjusted due to the IR effect is 0, that is, where the state of charge and the state of discharge of the battery cell are substantially the same.

Based on this knowledge, the applicant found out that the average value of the voltage of the battery cell obtained by measuring up until a time point where the integrated value of the voltage components adjusted due to the IR effect is zero (0) has a value very close to the average value of the open circuit voltage of the battery cell.

Further, the applicant found out that even when the average value of the open circuit voltage is used as the open circuit voltage of the battery cell at a certain time point, the error is not so big. Moreover, the applicant found out that in the case of a battery used in an application that continuously repeats charging/discharging, such an error value is small enough to be disregarded.

Hereinafter, an open circuit voltage estimating apparatus according to one aspect of the present disclosure will be explained.

Figure 2:
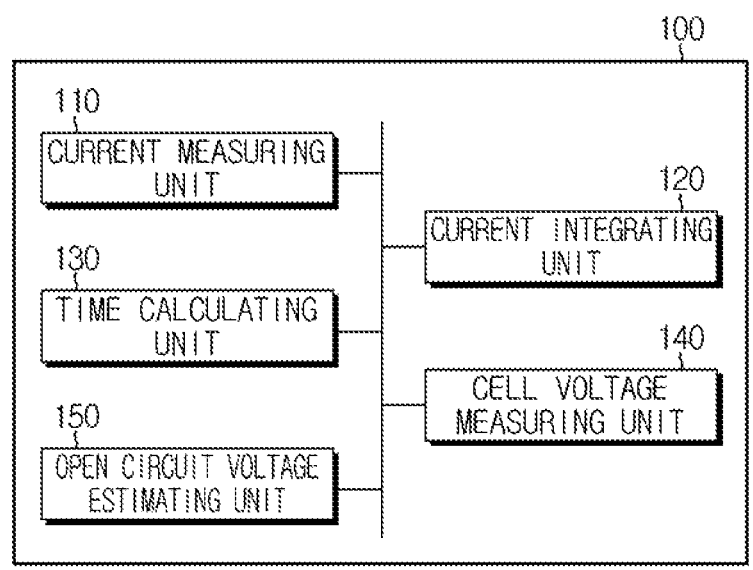
FIG. 2 is a view illustrating a functional configuration of an open circuit voltage estimating apparatus according to an embodiment of the present disclosure.
Figure 3:
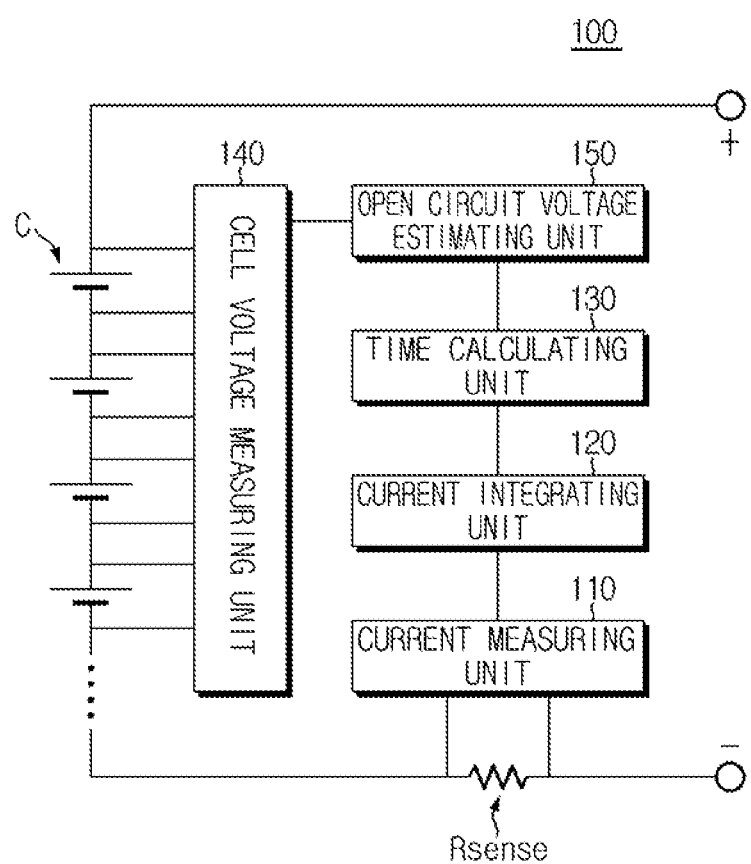
FIG. 3 is a view illustrating a connection configuration inside a battery pack of an open circuit voltage estimating apparatus according to an embodiment of the present disclosure.

FIG. 2 is a view illustrating a functional configuration of an open circuit voltage estimating apparatus according to an embodiment of the present disclosure, and FIG. 3 is a view illustrating a connection configuration inside a battery pack of an open circuit voltage estimating apparatus according to an embodiment of the present disclosure.

Referring to FIG. 2 and FIG. 3, the open circuit voltage estimating apparatus 100 according to an embodiment of the present disclosure includes a current measuring unit 110, a current integrating unit 120, a time calculating unit 130, a cell voltage measuring unit 140 and an open circuit voltage estimating unit 150.

The current measuring unit 110 may measure a charge/discharge current of a battery cell C. The current measuring unit 110 may measure the current flowing via the battery cell C using various current measuring methods.

Referring to FIG. 3, the battery pack includes a battery assembly. Here, the battery assembly means an assembly of two or more battery cells C, wherein the two or more battery cells C may be connected in series, in parallel, or in series-parallel. As illustrated in FIG. 3, in the case of a battery assembly configured by connecting battery cells C in series, the current of the battery cell C may be measured by measuring the current flowing via the battery assembly or the current flowing on a charge/discharge route of the battery pack.

For example, as illustrated in FIG. 3, it is possible to measure the voltage at both ends of a sense resistance $R_{sense}$ provided on the charge/discharge route of the battery pack, divide the measured voltage by a resistance value of the sense resistance $R_{sense}$ to obtain the current flowing on the charge/discharge route of the battery pack, and then, based on that current obtained, obtain the current flowing via the battery cell C.

Meanwhile, such a current measuring method is merely an embodiment, that is, the present disclosure is not limited to the aforementioned current measuring method.

The current integrating unit 120 may integrate the current measured by the current measuring unit 110 starting from an initial time. Here, the initial time may be the time when integrating of the current starts.

For example, the current integrating unit 120 may sum the current continuously measured by the current measuring unit 110. In another example, the current integrating unit 120 may integrate the current discretely measured by the current measuring unit 110. According to an embodiment, a continuous current integrating operation starting from the initial time t1 to an arbitrary time t2 may be performed respectively using the Equation below.

$$\int_{t1}^{t2} I(t)dt \qquad \text{<Equation 1>}$$

Here, I(t) is the current continuously measured by the current measuring unit 110. The current integrating unit 120 according to an embodiment of the present disclosure may sum the continuously measured current by integrating I(t) over a section from t1 to t2.

The time calculating unit 130 may calculate a time where the integrated current value integrated by the current integrating unit 120 is within a critical range. Here, the time within a critical range may be called a critical time.

The critical range may be set to be the range where the integrated current value is close to 0. That is, the critical range may be set to be the range where the sum of the charging current and the discharging current of the battery cell C is close to 0. In other words, the critical range may be set to be the range where the charging current and the discharging current of the battery cell C offset each other. Setting the critical range as aforementioned is for offsetting the error between the actually measured voltage and the open circuit voltage caused by internal resistance and the like. This can be understood based on the Equations below.

$$V = OCV \pm I \cdot R \qquad \text{<Equation 2>}$$

Here, V represents a dynamic voltage of the battery cell C, OCV represents the open circuit voltage of the battery cell C, I represents the current flowing through the battery cell C, and R represents the internal resistance of the battery cell C. Further, the dynamic voltage V is a voltage of the battery cell C in which the effect caused by the internal resistance and the like is reflected. It can be said as the voltage value measured when measuring the voltage of the battery cell C.

The average value obtained from Equation 2, that is, the average value of the dynamic voltage equals Equation 3 below, and Equation 3 may be represented as Equation 4.

$$Avg(V) = Avg(OCV) \pm Avg(I \cdot R) \qquad \text{\textlangle Equation 3\textrangle}$$

$$\frac{\int_{t_0}^{t_0+T} V(t)dt}{T} = \frac{\int_{t_0}^{t_0+T} OCV(t)dt}{T} \pm \frac{\int_{t_0}^{t_0+T} I(t) \cdot R(t)dt}{T} \qquad \text{\textlangle Equation 4\textrangle}$$

Here, $t_0$ is the initial time.

Here, when term $$\frac{\int_{t_0}^{t_0+T} I(t) \cdot R(t)dt}{T}$$

at the right side of Equation 4 is removed, the average value of the open circuit voltage Avg(OCV) may be obtained by obtaining the average value of the dynamic voltage Avg(V). That is, when term $$\frac{\int_{t_0}^{t_0+T} I(t) \cdot R(t)dt}{T}$$

at the right side of Equation 4 is removed, the average value of the measurement value of the battery cell C equals the average value of the open circuit voltage. In other words, when the integrated current value is 0, the average value of the open circuit voltage Avg(OCV) may be derived by measuring the voltage of the battery cell C and obtaining the average value of the measured voltage of the battery cell C for a time from the initial time to an operation time.

Meanwhile, R(t) at the right side of Equation 4 representing the internal resistance may be treated as a constant number that does not depend on change of time provided that the time is sufficiently short. That is, R(t) may be treated as R. Therefore, term $$\frac{\int_{t_0}^{t_0+T} I(t) \cdot R(t)dt}{T}$$

at the right side of Equation 4 may be represented as below.

$$\frac{\int_{t_0}^{t_0+T} I(t) \cdot R(t)dt}{T} \approx \frac{\int_{t_0}^{t_0+T} I(t) \cdot R\,dt}{T} = \frac{R \cdot \int_{t_0}^{t_0+T} I(t)dt}{T} \qquad \text{\textlangle Equation 5\textrangle}$$

Therefore, when T that satisfies Equation 6 below is found, term $$\frac{\int_{t_0}^{t_0+T} I(t) \cdot R(t)dt}{T}$$

at the right side of Equation 4 can be removed. As a result, the average value of the open circuit voltage Avg(OCV) may be obtained by obtaining the average value of the dynamic voltage Avg(V).

$$\int_{t_0}^{t_0+T} I(t)dt \approx 0 \qquad \text{\textlangle Equation 6\textrangle}$$

In other words, when the integrated current value is 0 or close to 0, term $$\frac{\int_{t_0}^{t_0+T} I(t) \cdot R(t)dt}{T}$$

at the right side of Equation 4 can be removed.

Further, whether or not the integrated current value is close to 0 as aforementioned may be determined based on the Equation below.

$$|\int_{t_0}^{t_0+T} I(t)dt| \leq I_0 \qquad \text{\textlangle Equation 7\textrangle}$$

Here, $I_0$ is a constant number for setting the critical range. It can be called a critical constant. That is, the critical range or the critical constant may be set to be in a range such that the integrated current value can be set close to 0 as an error range if not 0. One skilled in the related art should be able to set an appropriate critical range or critical constant through experiments or simulations, etc.

The time calculating unit 130 may calculate the time where the integrated current value integrated by the current integrating unit 120 is within the critical range. Here, the critical time may be a value within a certain range. The time calculating unit 130 may calculate the critical time by selecting an arbitrary value from values included in the certain range.

Optionally, the time calculating unit 130 may calculate the time point where the integrated current value is 0 as the critical time. That is, the time calculating unit 130 may calculate $t_0+T$ that satisfies the Equation below as the critical time. In other words, the time calculating unit 130 may integrate the current starting from the initial time $t_0$ and calculate the time point where the integrated current value is 0 as the critical time ($t_0+T$). Here, the operation time may be T, that is the difference between the critical time and the initial time.

$$\int_{t_0}^{t_0+T} I(t)dt = 0 \qquad \text{\textlangle Equation 8\textrangle}$$

Further optionally, the time calculating unit 130 may calculate the time in which the mathematical symbol of the integrated current value changes as the critical time. That is, the time calculating unit 130 may calculate the time in which the magnitude of the integrated current value changes from a positive number + to a negative number –, or from a negative number – to a positive number + as the critical time.

Further, the time calculating unit 130 may transmit the calculated critical time to an open circuit voltage estimating unit 150 that will be explained hereinafter.

The cell voltage measuring unit 140 may measure a voltage of the battery cell C. The cell voltage measuring unit 140 may measure the voltage of the battery cell C by various well known voltage measuring methods.

For example, as illustrated in FIG. 3, in the case where the battery pack includes a battery assembly consisting of a plurality of battery cells C, the cell voltage measuring unit 140 may measure the voltage of the plurality of battery cells C. Here, the cell voltage measuring unit 140 may measure the voltage of each battery cell C by measuring the voltage at both ends of each battery cell C.

Further, the cell voltage measuring unit 140 may transmit the measured voltage of the battery cell C to the open circuit voltage estimating unit 150 that will be explained hereinafter.

The open circuit voltage estimating unit 150 may calculate an average value of the voltage of the battery cell C measured by the cell voltage measuring unit 140. Here, the open circuit voltage estimating unit 150 may obtain an arithmetic average value of the voltage of the battery cell C using the voltage of the battery cell C measured during a certain time. Here, the certain time may be the operation time. For this purpose, the open circuit voltage estimating unit 150 may receive transmission of information on the operation time from the time calculating unit 130, and receive transmission of information on the voltage of the battery cell C from the cell voltage measuring unit 140.

According to an embodiment, the open circuit voltage estimating unit 150 may calculate the average value of the voltage by integrating the cell voltage starting from the initial time to the critical time, that is, integrating the cell voltage during the operation time, and then dividing the integrated cell voltage by the operation time. That is, the open circuit voltage estimating unit 150 may calculate the average value of the voltage using the Equation below.

$$\frac{\int_{t_0}^{t_0+T} V(t)dt}{T} \qquad \langle\text{Equation 9}\rangle$$

The open circuit voltage estimating unit 150 may estimate the average value of the voltage calculated through the aforementioned method as the open circuit voltage of the battery cell C. Further, the open circuit voltage of the battery cell C estimated through the aforementioned method may be used for various purposes.

According to another aspect of the present disclosure, the aforementioned open circuit voltage estimating apparatus 100 may be used in balancing. That is, a cell balancing apparatus 200 according to another aspect of the present disclosure may include the aforementioned open circuit voltage estimating apparatus 100.

Figure 4:
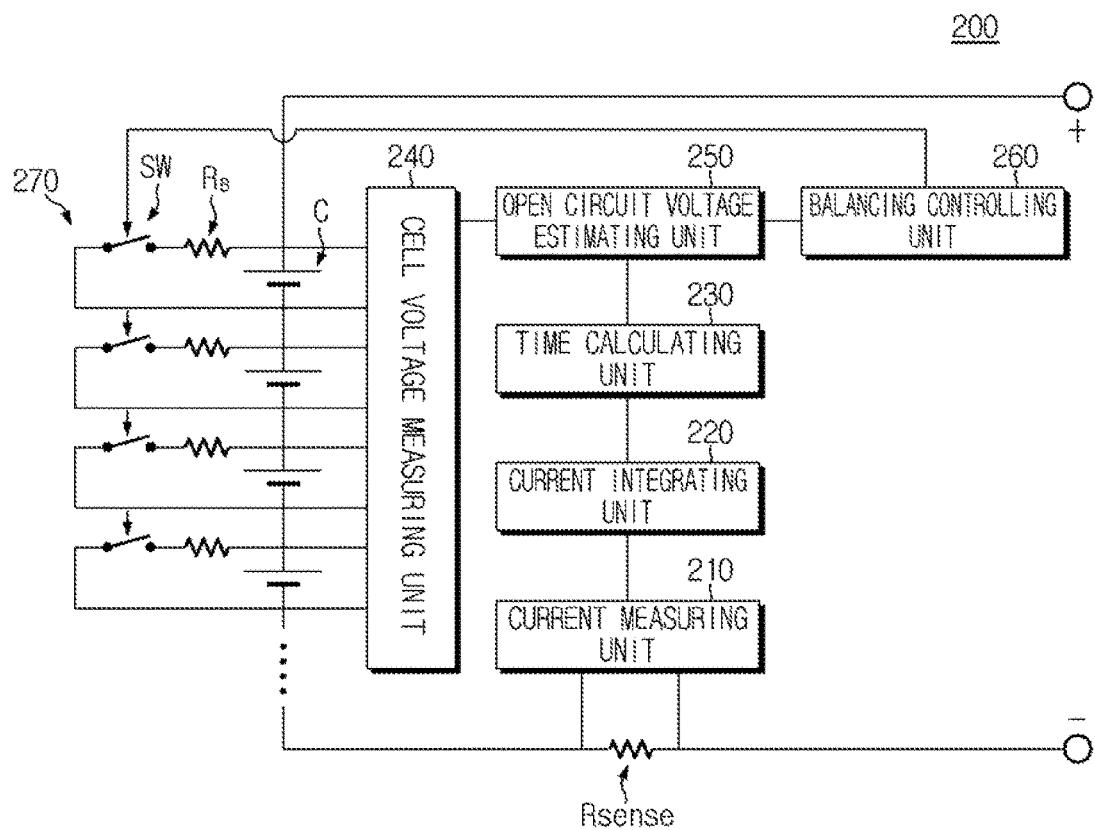
FIG. 4 is a view illustrating a cell balancing apparatus according to an embodiment of the present disclosure.

FIG. 4 is a view illustrating a cell balancing apparatus according to an embodiment of the present disclosure.

Referring to FIG. 4, the cell balancing apparatus 200 according to an embodiment of the present disclosure includes the aforementioned open circuit voltage estimating apparatus 100 and a balancing circuit 270, and further includes a balancing controlling unit 260 that connects the open circuit voltage estimating apparatus 100 and the balancing circuit 270. Here, regarding the present open circuit voltage estimating apparatus 100, the explanation on the aforementioned open circuit voltage estimating apparatus 100 may be applied identically as it is, and thus repeated explanation will be omitted.

The current measuring unit 210 may measure the current flowing through the battery cell C. In the present embodiment, the current measuring unit 210 adopts a method of measuring the current flowing on the charge/discharge route of the battery pack.

The current integrating unit 220 may integrate the current measured by the current measuring unit 210 starting from the initial time.

The time calculating unit 230 may calculate the critical time, that is the time where the integrated current value integrated by the current integrating unit 220 is within the critical range.

The cell voltage measuring unit 240 may measure the voltage of the battery cell C.

The open circuit voltage estimating unit 250 may calculate the average value of the voltage measured by the cell voltage measuring unit 240 for the time during the operation time. Further, the open circuit voltage estimating unit 250 may estimate the calculated average value of the voltage as the open circuit voltage of the battery cell C.

The balancing controlling unit 260 controls the balancing circuit 270 using the open circuit voltage of the battery cell C estimated by the open circuit voltage estimating unit 250. That is, the balancing controlling unit 260 controls the balancing circuit 270 such that the deviation of the voltage of the plurality of battery cells C is reduced.

The balancing circuit 270 is connected to each battery cell C to balance the voltage of each battery cell C. The balancing circuit 270 plays a role of decreasing or increasing the voltage of each battery cell C by way of control of the balancing controlling unit 260. The balancing circuit 270 may be realized as a charging circuit that charges the battery cell C to increase the voltage, or else, as a discharging circuit that discharges the battery cell C to decrease the voltage, or as a circuit configured in combination of the charging circuit and the discharging circuit. According to an embodiment, the balancing circuit 270 may be realized as a discharging circuit that includes a resistance element $R_B$ and a switch SW, as illustrated in FIG. 4. Here, the switch SW is an element that may be optionally turned-on or turned-off, for example, a field effect transistor (FET) element.

The discharging circuit may be connected to each battery cell C in parallel.

In such an embodiment, the balancing controlling unit 260 may control the switch SW to discharge the battery cell C. That is, the balancing controlling unit 260 may turn-on the switch SW connected to a battery cell C having a higher voltage than other battery cells C to decrease the voltage of the battery cell C.

According to another aspect of the present disclosure, the aforementioned open circuit voltage estimating apparatus 100 may be included in a battery pack. In other words, a battery pack according to another aspect of the present disclosure may include the aforementioned open circuit voltage estimating apparatus 100.

Further, an energy storage system according to another aspect of the present disclosure may include the aforementioned open circuit voltage estimating apparatus 100. Optionally, the energy storage system may be an energy storage system (ESS) used in frequency regulation (FR) of power generation equipment. Such an energy storage system for frequency regulation performs charging/discharging continuously without any rest time, and thus may be regarded as an application suitable for the aforementioned open circuit voltage estimating apparatus 100 to be adopted.

Hereinafter, an open circuit voltage estimating method according to another aspect of the present disclosure will be explained. The open circuit voltage estimating method according to the another aspect of the present disclosure may be a method for estimating an open circuit voltage using the aforementioned open circuit voltage estimating apparatus 100, and the subject of each step that performs the open circuit voltage estimating method may be each configurative element of the aforementioned open circuit voltage estimating apparatus 100.

Figure 5:
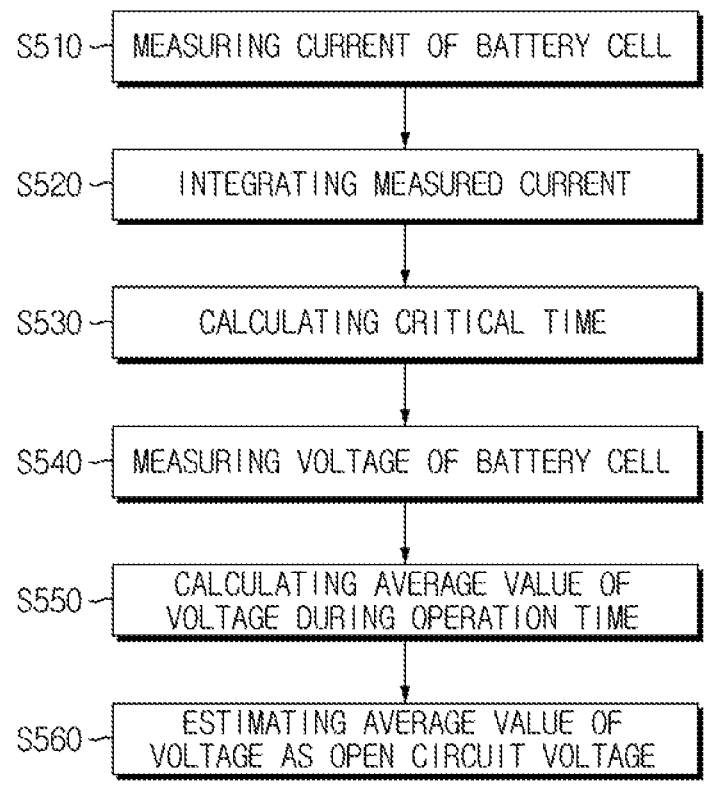
FIG. 5 is a flowchart illustrating an open circuit voltage estimating method according to an embodiment of the present disclosure.

FIG. 5 is a flowchart illustrating an open circuit voltage estimating method according to an embodiment of the present disclosure.

Referring to FIG. 5, first of all, the open circuit voltage estimating method according to an embodiment of the present disclosure measures a charge/discharge current of a battery cell C (S510). Next, the current measured at the measuring step (S510) is integrated starting from the initial time (S520). Next, a critical time, that is the time where the integrated current value integrated at the current integrating step (S520) is within a critical range, is calculated (S530).

Meanwhile, the open circuit voltage estimating method according to an embodiment of the present disclosure may perform measurement of a voltage of the battery cell C together with the measurement of the charge/discharge current of the battery cell C (S540). That is, there is no order of time series between the current measurement (S510) and the voltage measurement (S540), but are performed independently.

Further, the open circuit voltage estimating method according to an embodiment of the present disclosure calculates the average value of the voltage measured at the step (S540) of measuring the voltage (S550). Here, the calculated average value of the voltage is the average value of the voltage value measured during the time starting from the initial time until the critical time. In other words, it can be said as the average value of the voltage value measured during the operation time. The open circuit voltage estimating method according to an embodiment of the present disclosure calculates the average value of the voltage during the operation time (S550), and estimates the calculated average value of the voltage as the open circuit voltage (S560).

The present disclosure has been described in detail. However, it should be understood that the detailed description and specific examples, while indicating preferred embodiments of the disclosure, are given by way of illustration only, and various changes and modifications within the scope of the disclosure will become apparent to those skilled in the art from this detailed description.

Meanwhile, it is apparent to one skilled in the related art that although the term '~unit' is used in the present specification, this terms represents a logical configurative unit, and thus does not represent a configurative element that must be physically separated from other configurative units, and each configurative unit must not necessarily be physically realized by one element or device.

The characteristics described in the individual embodiments of the present disclosure may be implemented in combination into one single embodiment. In contrast, a variety of characteristics described herein as a single embodiment may be individually implemented in a variety of embodiments, or implemented in a proper subcombination.

What is claimed is:

1. A cell balancing apparatus comprising:
   an open circuit voltage estimating apparatus including:
   a current measuring unit configured to measure a charge/discharge current of a battery cell,
   a current integrating unit configured to integrate the current measured by the current measuring unit starting from an initial time,
   a time calculating unit configured to calculate a critical time, that is a time where the integrated current value integrated by the current integrating unit is within a critical range,
   a cell voltage measuring unit configured to measure a voltage of the battery cell; and
   an open circuit voltage estimating unit configured to estimate an open circuit voltage of the battery cell by calculating an average value of the voltage measured by the cell voltage measuring unit during an operation time starting from the initial time until the critical time; and
   a balancing circuit configured to perform balancing between battery cells included in a battery assembly using an open circuit voltage estimated by the open circuit voltage estimating apparatus,
   wherein the open circuit voltage estimating unit calculates the average value of the voltage by integrating a cell voltage for a time during the operation time and dividing the integrated cell voltage by the operation time.

2. The cell balancing apparatus of claim 1, wherein the time calculating unit calculates a time point in which the integrated current value is 0 as the critical time.

3. The cell balancing apparatus of claim 1, wherein the time calculating unit calculates a time where a mathematical symbol of the integrated current value changes as the critical time.

4. A battery pack comprising the cell balancing apparatus of claim 1.

5. An energy storage system comprising the cell balancing apparatus of claim 1.

6. An open circuit voltage estimating method comprising:
   measuring a charge/discharge current of a battery cell;
   integrating the current measured at the measuring step starting from an initial time;
   calculating a critical time, that is a time in which the integrated current value integrated at the current integrating step is within a critical range;
   measuring a voltage of the battery cell;
   estimating an open circuit voltage of the battery cell by calculating an average value of the voltage measured at the voltage measuring step during an operation time starting from the initial time until the critical time; and
   balancing, via a balancing circuit, battery cells included in a battery assembly using the estimated open circuit voltage,
   wherein the average value of the voltage is calculated by integrating a cell voltage for a time during the operation time and dividing the integrated cell voltage by the operation time.

7. The open circuit voltage estimating method of claim 6, wherein the critical time calculating step calculates a time point in which the integrated current value is 0 as the critical time.

8. The open circuit voltage estimating method of claim 6, wherein the operation time calculating step calculates a time in which a mathematical symbol of the integrated current value changes, as the critical time.

* * * * *